United States Patent
Porat

[11] 4,041,333
[45] Aug. 9, 1977

[54] HIGH SPEED INPUT BUFFER CIRCUIT
[75] Inventor: Eli Porat, Albany, Calif.
[73] Assignee: Intel Corporation, Santa Clara, Calif.
[21] Appl. No.: 640,435
[22] Filed: Dec. 15, 1975
[51] Int. Cl.² .................. H03K 19/08; H03K 3/26
[52] U.S. Cl. .................. 307/279; 307/304; 307/DIG. 1
[58] Field of Search .............. 307/DIG. 1, 251, 279, 307/304, 205, 291

[56] References Cited
U.S. PATENT DOCUMENTS 3,610,965  10/1971  Martin .......................... 307/279
3,624,423  11/1971  Borgini ......................... 307/279
3,764,823  10/1973  Donofrio et al. ............. 307/205
3,808,468  4/1974   Ludlow et al. ............... 307/304

Primary Examiner—Stanley D. Miller, Jr.
Assistant Examiner—B. P. Davies
Attorney, Agent, or Firm—Spensley, Horn & Lubitz

[57] ABSTRACT

A high speed buffer circuit having an input and complementary outputs includes a pair of feedback transistors for shortening the response time of the output signals at the complementary outputs and a capacitive load at each output for delaying the effect of the output signals on the feedback transistors.

10 Claims, 1 Drawing Figure

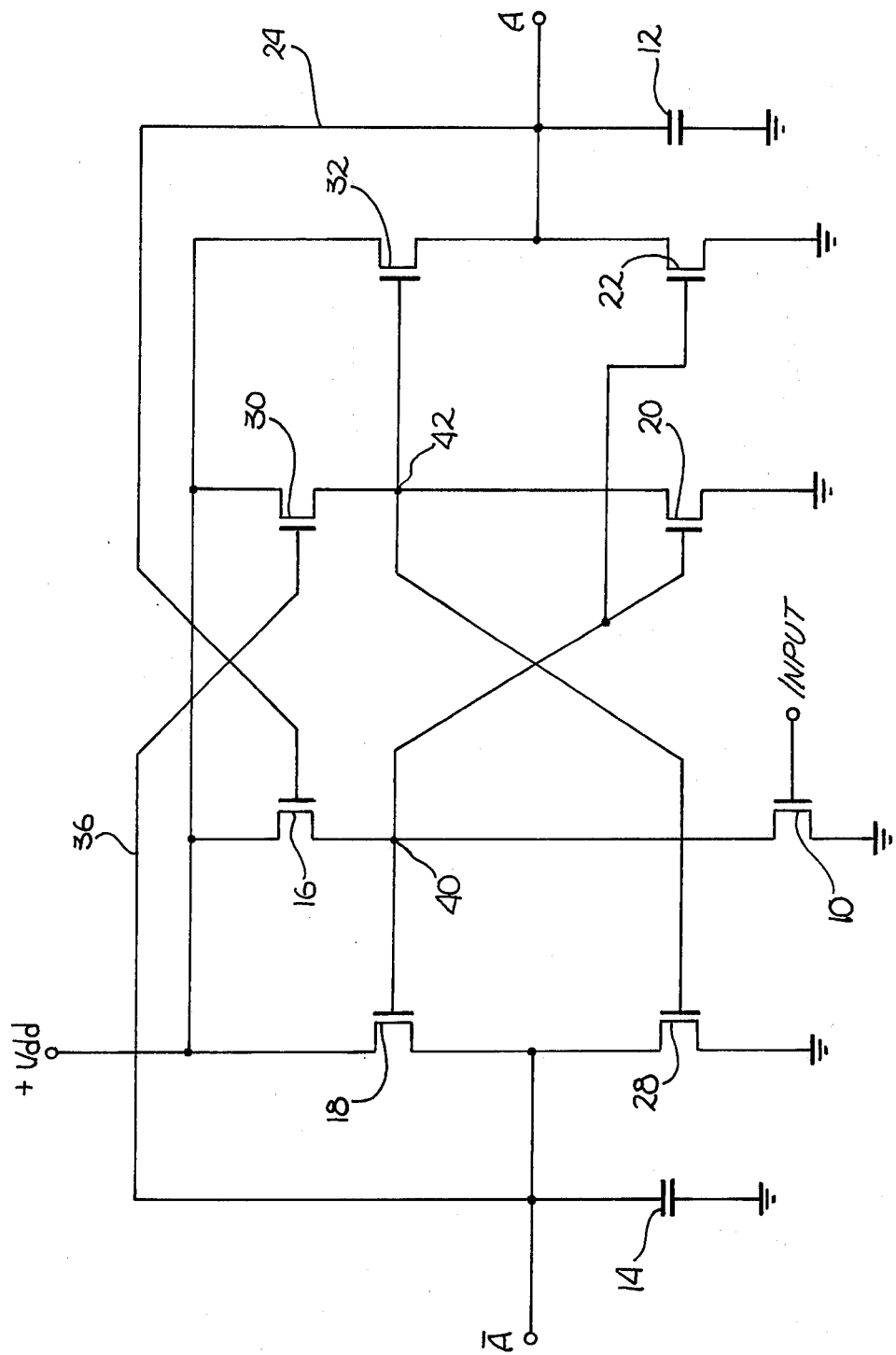

HIGH SPEED INPUT BUFFER CIRCUIT

BACKGROUND OF THE INVENTION

1. Field of the Invention

The invention relates to the field of buffer circuits and, in particular, to buffer circuits for high speed memory circuits.

2. Prior Art

Metal-oxide-silicon (MOS) circuits and devices are well known and used in the prior art and are recognized as low power consuming circuits. A typical MOS buffer circuit is found in *MOS Field-Effect Transistors and Integrated Circuits,* Paul Richman, published in 1973 by John Wiley & Son (see Figure 7.20 and the accompanying text). While MOS circuits have the advantages of power consumption, and high-functional packing density, low cost and simplified masking layout, nonetheless bipolar circuits have had to be used for buffer circuits where fast switching times were required due to the limited speed of MOS circuits. In addition, with the advent of even higher speed memory circuits it has become necessary to increase the switching times of the buffer circuits while still maintaining compatability with TTL circuitry and retaining the low power consumption desirable in all integrated circuits.

Accordingly, it is a general object of the present invention to provide an improved input buffer circuit for memory circuits.

It is another object of the present invention to provide an improved input buffer circuit which will achieve fast switching time without sacrificing low power consumption.

It is yet another object of the present invention to provide a high speed input buffer circuit using MOS circuitry.

SUMMARY OF THE INVENTION

A buffer circuit useful for high speed memory circuits and particularly suited for the use of MOS technology is provided. The circuit has an input coupled to an input transistor and a pair of a complementary outputs having capacitive loads coupled thereto. Means are provided for feeding back the output signals at said outputs in order to shorten the response time of the circuit in providing a pair of complementary output signals in response to an input signal at said input. The capacitive loads at the complementary output of the circuit are used for delaying the effect of the output signals on the feedback means.

The novel features which are believed to be characteristic of the invention, both as to its organization and its method of operation, together with further objects and advantages thereof, will be better understood from the following description in connection with the accompanying drawing in which a presently preferred embodiment of the invention is illustrated by way of example. It is to be expressly understood, however, that the drawing is for purposes of illustration and description only and is not intended as a definition of the limits of the invention.

DETAILED DESCRIPTION OF THE INVENTION

An input buffer circuit is disclosed which is adaptable for receiving a TTL signal and converting it to a higher voltage level signal at a response rate compatable with high speed memory circuits. In the presently preferred embodiment the buffer circuit is fabricated on a P-type substrate but an N-type substrate could be utilized. The buffer circuit utilizes MOS transistors and includes both enhancement-type and depletion-type N-channel devices. In the presently preferred embodiment the gates of the transistor employ polycrystalline silicon but metal gates may be utilized. While N-channel devices are utilized because of their greater speed, P-type channel devices may also be utilized.

Referring to the Figure, the input of the circuit is connected to the base of an input transistor 10 while the true and inverted outputs of the circuit, designated as A and $\overline{A}$, have coupled thereto capacitive loads 12 and 14. The capacitive loads 12 and 14 may be provided by discrete capacitors formed as part of the input buffer circuit, may be provided by the capacitive loading from a circuit coupled to outputs A and $\overline{A}$, or may be a combination of both such types of capacitive loading. The source of input transistor 10 is connected to ground while the drain thereof is connected to the source of feedback transistor 16 and the gates of transistors 18, 20 and 22. The gate of transistor 16 is coupled to the output A by a feedback line 24. The source of transistor 18 is connected to the output $\overline{A}$ and to the drain of transistor 28. The gate of transistor 28 is coupled to the source of transistor 30, the gate of transistor 32 and the drain of transistor 20. The source of transistor 32 is coupled to the output A and to the drain of transistor 22. The sources of transistors 28, 20 and 22 are well coupled to ground while the drains of transistors 18, 16, 30 and 32 are coupled to a supply source voltage Vdd. Finally, the gate of transistor 30 is coupled by feedback line 36 to output $\overline{A}$.

As stated above, the drains of transistors 18, 16, 30 and 32 are coupled to the supply source voltage Vdd which in the presently preferred embodiment is approximately 5 volts. Since the input in the presently preferred embodiment is coupled to a TTL circuit, it receives either one of two potentials, 0.8 volts (or less) or 2 volts (or more). When the input is at 0.8 volts (or less) it is said to be in a a low state and transistor 10 is not conductive; when the input is at 2 volts (or more) it is said to be in a high state and the transistor 10 is conductive. In operation, if a high state is applied to transistor 10, transistor 10 will become conductive, driving node 40 to a low condition. This low condition will also be applied at the gates of transistors 18, 20 and 22 causing them to be non-conductive. When transistor 20 becomes nonconductive node 42 will go to a high condition thus causing transistor 32 to become conductive and thereby supply output current for the output A at the voltage level of the source voltage Vdd. At the same time that transistor 18 becomes non-conductive due to the low condition on node 40, transistor 28 becomes conductive due to the high condition on node 42 and the output voltage at output $\overline{A}$ swiftly drops to zero.

In a like fashion, when a low state is applied to the input, transistor 10 becomes non-conductive and node 40 goes to a high condition due to its coupling to feedback transistor 16. When node 40 goes to a high condition transistors 18, 20 and 22 become conductive and node 42 drops to a low condition thereby causing transistor 32 to become non-conductive and causing the voltage at output A to drop to zero. At the same time the low condition at node 42 causes transistor 28 to become non-conductive and, since transistor 18 has become conductive, output $\overline{A}$ rises to the source voltage Vdd. Thus, it is seen that the application of high and low states to input transistor 10 results in correspondingly complementary high and low states, or voltage levels, at the outputs A and $\overline{A}$. Transistors 18 and 32 are generally referred to as pull-up transistors and transistors 20, 22 and 28 are generally referred to as pull-down transistors.

As is apparent, the speed of the buffer circuit depends to a great extent on how quickly nodes 40 and 42 can change to high and low conditions in response to appropriate input signals. Since the nodes 40 and 42 are coupled to the sources of feedback transistors 16 and 30, the speed of response of the nodes 40 and 42 depend greatly on the state of the transistors 16 and 30 immediately prior to the onset of the input signals. If it is assumed that the previous input signal was in a high state, the voltage level as output A is also in a high state and, since the base of feedback transistor 16 is coupled to the output A by line 24, the feedback transistor 16 will have been made conductive upon the output A going to the high state. In a like fashion, transistor 30 will become non-conductive when the input goes to a high state due to the complementary output $\overline{A}$ going to a low state.

Thus, when a low input signal appears at the base of transistor 10 making it non-conductive, feedback transistor 16 pulls the voltage at the node 40 up very fast thereby quickly making transistors 20 and 22 conductive. Since transistor 30 is in a non-conductive state, the voltage at node 42 falls very quickly thus causing transistor 32 to become non-conductive and, since transistor 22 is conductive, the voltage level at output A drops very quickly. Likewise, the fast voltage increase at node 40 causes transistor 18 to become quickly conductive and, since the fast voltage decrease at node 42 causes transistor 28 to become non-conductive, the voltage level at output $\overline{A}$ rises very quickly.

Thus, the previous states of transistors 16 and 30 have shortened the fall time of the voltage at output A and the rise time of the voltage at output $\overline{A}$ when the input signal at the input went from a high state to a low state. Conversely, a low state at output A and a high state at output $\overline{A}$ causes transistors 16 and 30 to become non-conductive and conductive, respectively, so that when the input signal goes from a low state to a high state the voltages at nodes 40 and 42 will fall and rise, respectively, very quickly thereby shortening the rise time of the voltage at output A and the fall time of the voltage at output $\overline{A}$.

It should be noted, however, that while the voltage at node 40 is being pulled up very rapidly by the conductive state of feedback transistor 16 when a low state is applied to the input, the resultant low state at the output A would cause the feedback transistor 16 to quickly become non-conductive and thus slow the rise time of the voltage at the node 40. To obviate this and the concurrent problem at feedback transistor 30, there is provided, as recited before, capacitive loads 12 and 14 coupled to the outputs A and $\overline{A}$. Since the voltage at output A has previously been in a high state, then the capacitive load 12 is in a charged condition. When node 40 rises to a high condition, thus causing the high voltage state at output A to fall to a low state, the effect of the voltage state at output A falling from a high to a low state on the state of feedback transistor 16 will be delayed because of the charge of the capacitive load 12. This delay keeps feedback transistor 16 in a conductive state sufficiently long for node 40 to quickly rise to a high voltage condition. At the same time the high voltage condition at the node 40 causes transistor 18 to become conductive and to charge the capacitive load 14 coupled to the output $\overline{A}$. This charging of capacitive load 14 prevents feedback transistor 30 from becoming conductive too quickly and thus preventing the voltage condition at node 42 from quickly dropping. It is apparent that at the next pulse the charge that is now on capacitive load 14 prevents feedback transistor 30 from becoming non-conductive too quickly and thus allows the voltage level at node 42 to quickly rise. This quick rise causes transistors 28 and 32 to become highly conductive, causing a rapid increase in the voltage level at the output A and a rapid decrease in the voltage level at the output $\overline{A}$.

Because of the feedback paths to feedback transistors 16 and 30 and the delays imposed by the capacitive loads 12 and 14, the feedback transistors 16 and 30 never reach a totally on or totally off condition in the dynamic operation of the circuit. Thus, the voltages at nodes 40 and 42 never rise completely to the Vdd voltage level nor do they drop completely to the zero or ground level. If it is assumed that the voltage source Vdd is at 5 volts, it has been found that when a low input signal is applied node 40 rises to 3 volts and when a high input signal is applied node 40 drops to 1 volt (and conversely the situation at node 42). Since the voltage at node 40 has to make only a 2 volt transition, that is from 1 volt to 3 volts, instead of a 5 volt transition, that is from zero volts to 5 volts, it is thus apparent that the switching time of the circuit is greatly enhanced.

While in the actual construction of the circuit is been found desirable for transistors 18, 16, 30 and 32 to be of the depletion type and transistors 28, 20 and 22 to be of the enhancement type, so as to achieve faster switching times, it is obvious that numerous modifications and departures may be made by those skilled in the art; thus, the invention is to be construed as being limited only by the spirit and scope of the appended claims.

I claim:

1. A high speed buffer circuit having an input and true and inverted outputs for receiving an input signal and producing true and inverted output signals therefrom comprising:
   an input transistor for receiving said input signal:
   means coupling said input transistor to said outputs, said outputs having capacitive loads coupled thereto; and
   feedback means coupling said outputs to said input transistor, said feedback means being operable for shortening the response time of said true and inverted output signals at said outputs in response to said input signal at said input, and said capacitive loads being operable for delaying the effect of said output signals on said feedback means, the capacitive loads coupled to said outputs being charged in accordance with the state of said input signal being applied to said input transistor to produce said output signals at said true and inverted outputs.

2. The circuit of claim 1 wherein said feedback means includes a pair of feedback transistors.

3. The circuit of claim 2 wherein one of said feedback transistors is directly coupled to said input transistor.

4. The circuit of claim 1 wherein said means coupling said input transistor to said outputs includes one or more transistors coupled to each of said outputs to pull-up the voltage of said output signals at said outputs and one or more transistors coupled to each of said outputs to pull-down the voltage of said output signals at said outputs.

5. The circuit of claim 4 wherein said feedback means includes a pair of feedback transistors and wherein said feedback transistors and said pull-up transistors are depletion-type transistors and said input transistor and said pull-down transistors are enhancement-type transistors.

6. The circuit of claim 5 wherein said transistors are N-type MOS transistors.

7. In a high speed buffer circuit having an input and at least a first output for receiving an input signal and producing at least a first output signal therefrom, the improvement comprising;
   feedback means coupling said input and said output for shortening the response time of an output signal at said output in response to an input signal at said input; and
   capacitive means coupled to said output for delaying the effect of said output signal on said feedback means, said capacitive means coupled to said output being charged in accordance with the state of said input signal being applied to said input to produce an output signal at said output.

8. The improvement of claim 7 wherein said circuit further includes at least a second complementary output, said second output having a capacitive means coupled thereto, said feedback means coupling said second output to said input, said capacitive means coupled to said second output being charged in accordance with the state of said input signal being applied to said input to produce an output signal at said second output.

9. A MOS high speed buffer circuit having an input and a pair of complementary outputs for providing true and inverted output signals comprising:
   an input transistor coupled to said input;
   a first feedback transistor coupled to said input transistor and said true output;
   a first pull-up transistor and first and second pulldown transistors coupling said input to said true output;
   a second feedback transistor coupled to said first pull-down transistor and said inverted output;
   a second pull-up transistor and third pull-down transistor coupling said input to said inverted output; and
   Capacitive means coupled to said true and inverted outputs for delaying the effect of said true and inverted output signals on said first and second feedback transistors.

10. The circuit of claim 9 wherein said first and second feedback transistors and said first and said first and second pull-up transistors are depletion-type transistors and said input transistor and said first, second and thrid pull-down transistors are enhancement-type transistors.

* * * * *